US006765429B2

United States Patent
Miyagi

(10) Patent No.: US 6,765,429 B2
(45) Date of Patent: Jul. 20, 2004

(54) SEMICONDUCTOR INTEGRATED CIRCUIT WITH LEAK CURRENT CUT-OFF CIRCUIT

(75) Inventor: Satoru Miyagi, Akiruno (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/395,252

(22) Filed: Mar. 25, 2003

(65) Prior Publication Data

US 2003/0184364 A1 Oct. 2, 2003

(30) Foreign Application Priority Data

Mar. 28, 2002 (JP) ........................................ 2002-092801

(51) Int. Cl.[7] .............................................. G05F 1/10
(52) U.S. Cl. ...................................... 327/534; 327/544
(58) Field of Search ................................ 327/530, 534, 327/535, 537, 538, 540, 541, 543, 544, 564, 565, 566

(56) References Cited

U.S. PATENT DOCUMENTS 5,880,623 A * 3/1999 Levinson .................... 327/540
6,031,778 A * 2/2000 Makino et al. ............. 365/226
6,643,162 B2 * 11/2003 Takeuchi et al. ............ 365/145

FOREIGN PATENT DOCUMENTS

| JP | 5-210976 | 8/1993 |
| JP | 7-212217 | 8/1995 |

* cited by examiner

Primary Examiner—Jeffrey Zweizig
(74) Attorney, Agent, or Firm—Arent Fox PLLC

(57) ABSTRACT

In the disclosed semiconductor integrated circuit, a plurality of power supply terminals of the logic circuit block are connected to the actual power supply line via the leak current cut-off circuit. When the logic circuit block is to be activated, the delay control circuit controls the leak current cut-off circuit to electrically connect the power supply terminal to the actual power supply line with a delay of the predetermined time. Therefore, when the logic circuit block is activated, voltage drop of the actual power supply line can be lowered to a small value and erroneous operation of the other logic circuit block in the activated condition due to the power supply noise can be prevented.

26 Claims, 14 Drawing Sheets

Prior Art

Prior Art

SEMICONDUCTOR INTEGRATED CIRCUIT WITH LEAK CURRENT CUT-OFF CIRCUIT

CROSS-REFERENCE TO RELATED APPLICATIONS

This application is based upon and claims the benefit of priority from the prior Japanese Patent Application No. 2002-92801, filed on Mar. 28, 2002, the entire contents of which are incorporated herein by reference.

BACKGROUND OF THE INVENTION

1. Field of the Invention

The present invention relates to a semiconductor integrated circuit, particularly to a semiconductor integrated circuit, having a leak current cut-off circuit, which has reduced current dissipation in the waiting condition.

2. Description of the Related Art

In recent years, high speed operation and low power consumption have been requested for the semiconductor integrated circuit to be loaded into mobile electronic apparatuses in order to satisfy the requirement for high speed operation and long-term drive. In order to realize low power consumption, the power supply voltage to be supplied must be lowered. However, when the power supply voltage is lowered, the operation speed is also lowered depending on the power supply voltage. To cover the lowering of operation speed, it is required to design a threshold voltage of each MOS transistor forming the semiconductor integrated circuit to a lower value.

However, when the threshold value of MOS transistor is lowered, a leak current increases in the waiting condition in each MOS transistor and thereby, the low power consumption in the semiconductor integrated circuit may be impeded. As a means for solving such problems, the MT-CMOS (Multi-Threshold-Voltage CMOS) technique as illustrated in FIG. 1 is known.

FIG. 1 is a schematic diagram illustrating a circuit example of the semiconductor integrated circuit using the conventional MT-CMOS technique. In this Figure, 121 designates an actual power supply line; 122, a power supply terminal; 123, a virtual power supply line; 124-$n$, a logic circuit block; 125, an internal circuit; 126, a ground terminal; 127, a leak current cut-off transistor; 128, a power control circuit.

In the semiconductor integrated circuit of the conventional art illustrated in FIG. 1, in each logic circuit block 124 forming the semiconductor integrated circuit, a plurality of leak current cut-off transistors 127 composed of a high threshold voltage transistor are provided between the power supply terminal 122 connected to the actual power supply line 121 and the virtual power supply line 123 provided within the logic circuit block 124. The internal circuit 125 is provided between the virtual power supply line 123 and ground terminal 126. In order to realize high speed circuit operation, the internal circuit 125 is formed of a low threshold voltage transistor having the threshold voltage which is lower than that of the leak current cut-off transistor 127.

The power control circuit 128 outputs, under the control of a control circuit (CPU or the like, not illustrated), power control signals PCNT1~$n$ for controlling ON and OFF states of the leak current cut-off transistors 127 provided within each logic circuit block.

When each logic circuit block is activated, corresponding leak current cut-off transistors 127 are turned ON with the power control signals PCNT1~$n$ and thereby the electrical power is supplied to the internal circuit 125 via the power supply terminal 122 and virtual power supply 123 from the actual power supply line 121. On the contrary, under the waiting condition of each logic circuit block, the corresponding leak current cut-off transistors 127 are turned OFF with the power control signals PCNT1~$n$ and thereby, supply of power to the internal circuit 125 is stopped.

Here, the leak current cut-off transistor 127 has the threshold voltage which is higher than that of each MOS transistor forming the internal circuit 125. Therefore, the leak current cut-off transistor 127 is capable of surely cutting off a current path extended from the actual power supply line 121 via the power supply terminal 122 and virtual power supply line 123. Accordingly, even when the internal circuit is formed of low threshold voltage transistors, power consumption of the internal circuit can surely be lowered.

FIG. 2 illustrates details of the structure of the leak current cut-off transistor 127 and internal circuit 125 illustrated in FIG. 1. The logic circuit block is formed in the vertical and horizontal layouts of a plurality of cells. Many cell strings illustrated in FIG. 2 are arranged in the vertical direction.

Each cell string is structured, for example, as illustrated in FIG. 2(A), by connecting a plurality of cells (logic gates) which are designed to include both high threshold voltage transistors as the leak current cut-off transistors and low threshold voltage transistors to form an internal circuit, considering the MT-CMOS technique.

On the other hand, when the cells (logic gates) structured only by the low threshold voltage transistors are used in which the MT-CMOS technique is not considered, a cell consisting of a high threshold voltage transistor is designed separately. Then each cell string is structured, as illustrated in FIG. 2(B), by connecting a plurality of cells consisting of only the high threshold voltage transistors and a plurality of cells consisting of only the low threshold voltage transistors.

In FIGS. 2(A) and 2(B), the power control signal PCNTn supplied from the power control circuit is inputted to the gate of the high threshold voltage transistor which acts as the leak current cut-off transistor. Each high threshold voltage transistor is set in the ON and OFF states with the power control signal PCNT-n to control the supply of power to the corresponding logic circuit block.

When, under the condition that the logic circuit blocks in the activated condition exist among a plurality of logic circuit blocks, the other logic circuit blocks in the waiting condition are activated, a problem rises in which a voltage drop of the actual power supply line 121 is temporarily generated in the timing that the corresponding leak current cut-off transistor 127 turns ON. The logic circuit blocks in the activated condition have erroneous operations because of such voltage drop.

FIG. 3 is a diagram for explaining the problems explained above. In regard to FIG. 3, an example will be explained in which the logic circuit block 124-1 in the waiting condition is activated under the condition that the logic circuit blocks 124-2~$n$ are in the activated condition.

As illustrated in FIG. 3, the power control circuit changes the corresponding power control signal PCNT1 to an L (ground potential VSS) level from an H (power supply potential VDD) level in order to activate the logic circuit block 124-1. In response to the level change of the power control signal PCNT1, a plurality of leak current cut-off transistors 127 within the logic circuit block 124-1 are turned ON simultaneously.

In the moment when the leak current cut-off transistors 127 turn ON, rapid supply of charges to the internal circuit 125 within the logic circuit block 124-1 is started and thereby the potential of the virtual power supply line 123 within the logic circuit block 124-1 rises rapidly. As a result, a large current flows into the current path from the actual power supply line 121 via the power supply terminal 122 and leak current cut-off transistor 127.

Accordingly, in this moment, the potential of the actual power supply line 121 temporarily drops to a large extent as illustrated in FIG. 3. The voltage drop of the actual power supply line 121 is transferred as a power supply noise to the other logic circuit blocks in the activated condition. With the power supply noise, the virtual power supply line of the logic circuit blocks 124-2~n in the activated condition also show a large voltage drop to trigger erroneous operations of the logic circuit blocks 124-2~n.

SUMMARY OF THE INVENTION

The present invention has been proposed considering the problems explained above, and it is therefore a general aspect of the present invention to provide a semiconductor integrated circuit which can control the power supply noise to a lower level at the time of activating the logic circuit block in the waiting condition and prevent erroneous operation of the other logic circuit blocks in the activated condition.

Another and a more specific aspect of the present invention is to provide a semiconductor integrated circuit comprising: a first power supply line to which a first potential is supplied; a logic circuit block which includes a first transistor having a first threshold voltage and a plurality of first power supply terminals; a first leak current cut-off circuit which is provided between the first power supply line and the logic circuit block and includes a second transistor having a second threshold voltage which is higher than the first threshold voltage, said first leak current cut-off circuit electrically connecting or disconnecting the first power supply line and the plurality of first power supply terminals; and a first delay control circuit which controls the first leak current-cut-off circuit to sequentially connect the first power supply line and each of the plurality of first power supply terminals with a predetermined time delay when the logic circuit block is activated.

In the semiconductor integrated circuit of the present invention, when the logic circuit block is activated, a plurality of power supply terminals are sequentially connected to the actual power supply line with the predetermined time delay by the corresponding delay control circuit and thereby charges are supplied on the time division basis to the logic circuit block.

Therefore, when the logic circuit block is activated, voltage drop of the actual power supply line can be reduced and the power supply noise for the other logic circuit block in the activated condition can also be reduced to a small value.

Accordingly, erroneous operation of the other logic circuit block in the activated condition due to the power supply noise can be prevented.

DESCRIPTION OF THE PREFERRED EMBODIMENT

Figure 4:
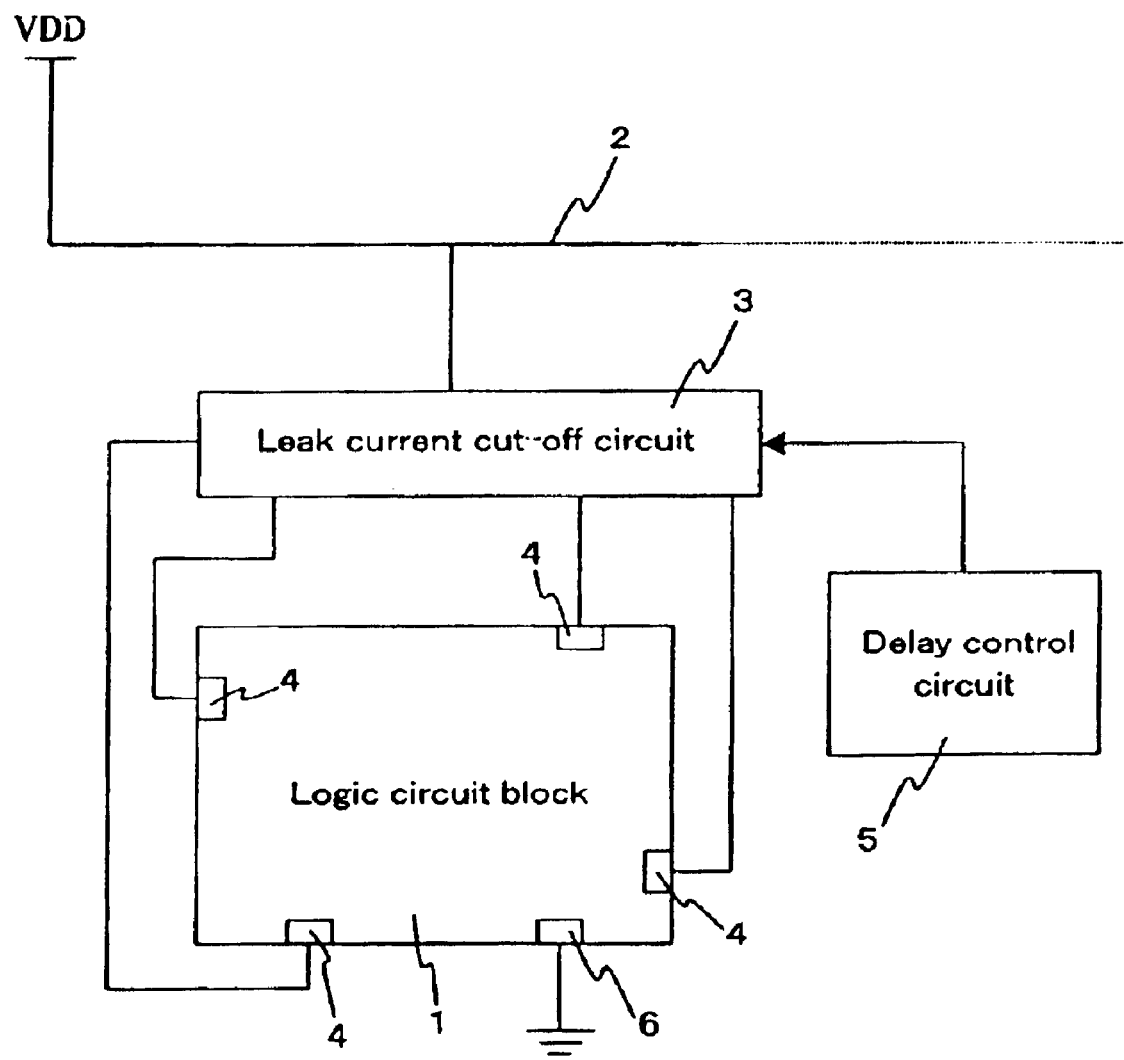
FIG. 4 is a schematic diagram of the semiconductor integrated circuit for explaining the principle of the present invention.

FIG. 4 is a schematic diagram of the semiconductor integrated circuit for explaining the principle of the present invention. In FIG. 4, the reference numeral 1 designates a logic circuit block; 2, an actual power supply line; 3, a leak current cut-off circuit; 4, a power supply terminal; 5, a delay control circuit; 6, a ground terminal.

In the semiconductor integrated circuit illustrated in FIG. 4, the logic circuit block 1 is provided with a plurality of power supply terminals 4 and each power supply terminal 4 is connected to the actual power supply line 2 via the leak current cut-off circuit 3.

The leak current cut-off circuit 3 is formed of a high threshold voltage transistor having a threshold voltage which is higher than that of a low threshold voltage transistor included in the logic circuit block 1. When the logic circuit block 1 is in the activated condition, the leak current cut-off circuit 3 electrically connects a plurality of power supply terminals 4 to the actual power supply line 2 under the control of the delay control circuit 5. When the logic circuit block 1 is in the waiting condition, the leak current cut-off circuit 3 electrically disconnects all of the power supply terminals 4 from the actual power supply line 2 and cuts off the current path of the leak current flowing into a plurality of power supply terminals 4 from the actual power supply line 2.

The delay control circuit 5 controls operation of the leak current cut-off circuit 3 when the logic circuit block 1 is activated. The delay control circuit 5 controls so that the leak current cut-off circuit 3 electrically connects each of the power supply terminals 4 to the actual power supply line 2 with each connection thereof being delayed by a predetermined time.

As explained above, in the semiconductor integrated circuit of the present invention, when the logic circuit block 1 is activated, the delay control circuit 5 controls so that a plurality of power supply terminals 4 is sequentially connected to the actual power supply 2 with delay of the predetermined time. As a result, supply of charges to the logic circuit block 1 is executed on the time division basis and amount of current flowing into the current path from the actual power supply line 2 via the lead current cut-off circuit 3 and each power supply terminal 4 is also reduced.

Therefore, voltage drop of the actual power supply line which is generated in the timing of activating the logic circuit block 1 can be lowered and the power supply noise for the other logic circuit block already in the activated condition can also be lowered. Consequently, according to the present invention, it can be prevented that the other logic circuit blocks in the activated condition have erroneous operation due to the power supply noise.

The preferred embodiments of the present invention will be explained with reference to the accompanying drawings. However, the technical field of the present invention is not limited to the embodiments and the technical field of the present invention is restricted only by the claims thereof and the equivalents thereof.

Figure 5:
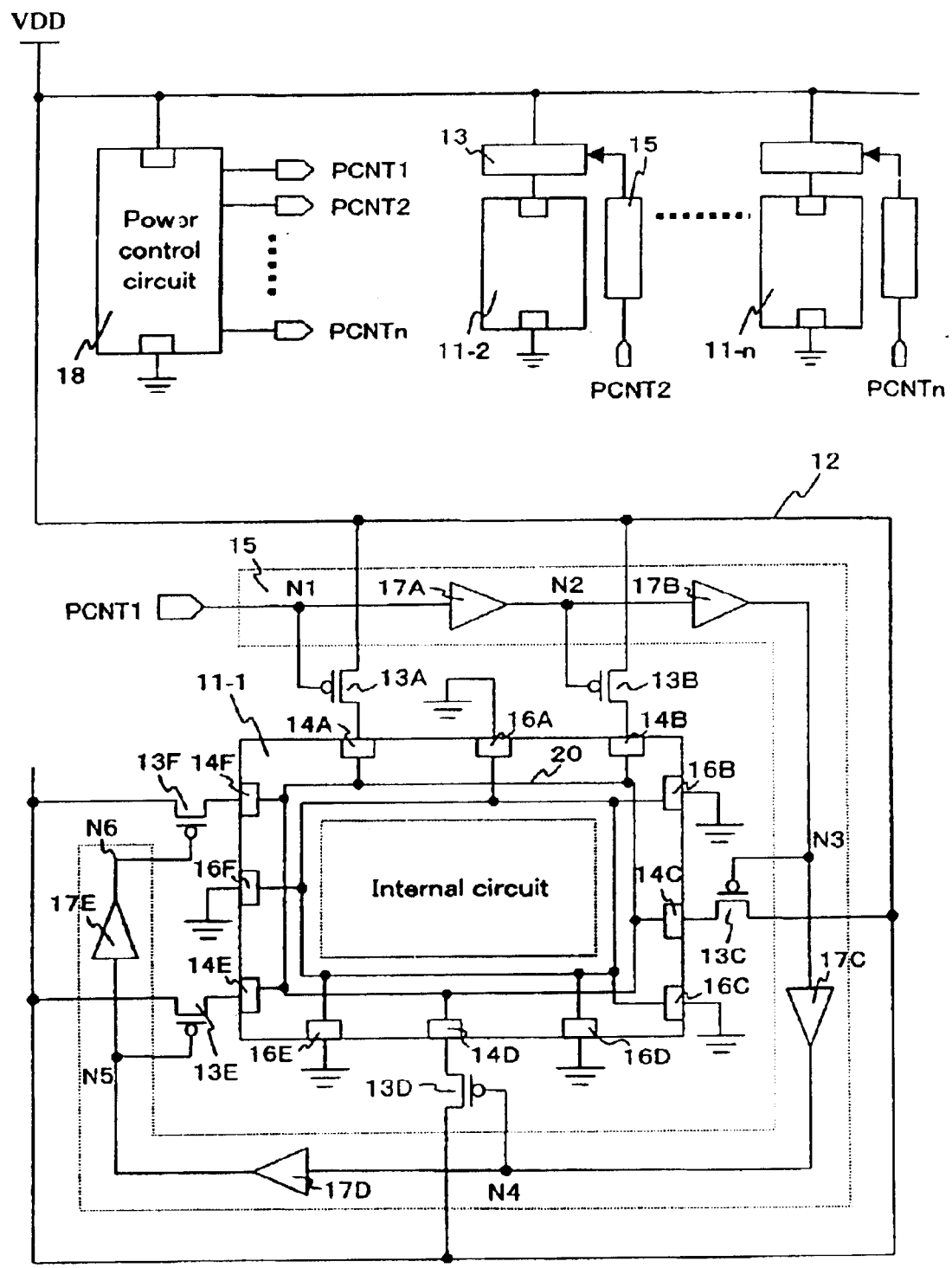
FIG. 5 is a schematic structural diagram illustrating the first embodiment of the semiconductor integrated circuit of the present invention.

FIG. 5 is a schematic diagram illustrating the first embodiment of the semiconductor integrated circuit of the present invention. In FIG. 5, the reference numeral 11 designates a logic circuit block; 12, an actual power supply line; 13, a leak current cut-off transistor; 14, a power supply terminal; 15, a delay control circuit; 16, a ground terminal; 17, a delay buffer; 18, a power control circuit; 20, a power supply potential line.

The semiconductor integrated circuit of FIG. 5 is formed including a plurality of logic circuit blocks 11-1~n connected to the actual power supply line 12 and the power control circuit 18. A plurality of logic circuit blocks 11-1~n and power control circuit 18 are respectively connected via a bus (not illustrated) for exchange of various control signals and data. Here, the power supply voltage VDD supplied to the actual power supply line 12 is, for example, 0.7 V. The actual power supply line 12 forms the first power supply line.

Each logic circuit block is formed including a low threshold voltage transistor to realize high speed circuit operation. The logic circuit block is, for example, a storage circuit such as memory, a logic circuit such as DSP and a control circuit such as CPU.

Figure 1:
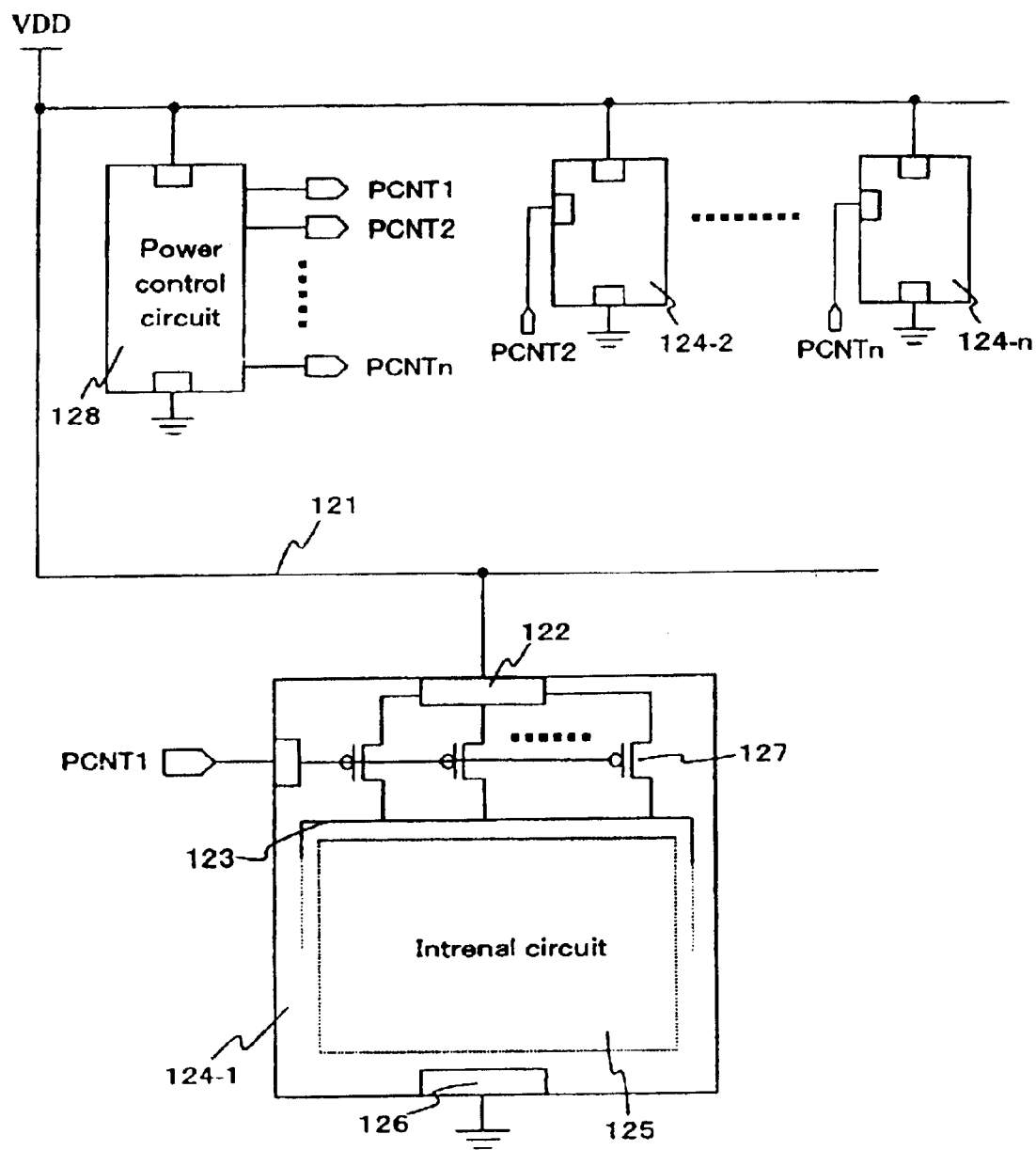
FIG. 1 is a schematic diagram illustrating a circuit example of the semiconductor integrated circuit using the MT-CMOS technique of the conventional art.
Figure 2A:
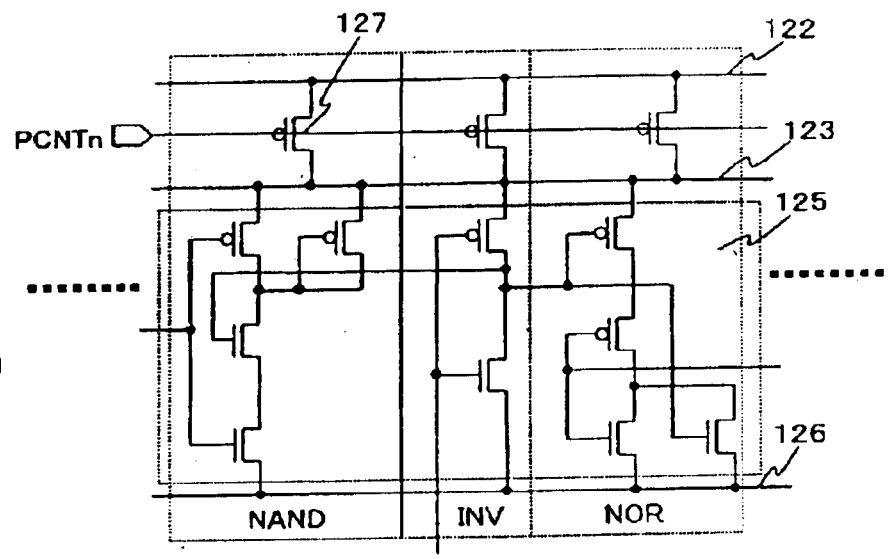
FIG. 2 is a diagram for explaining detail structures of a leak current cut-off transistor and internal circuit.
Figure 2B:
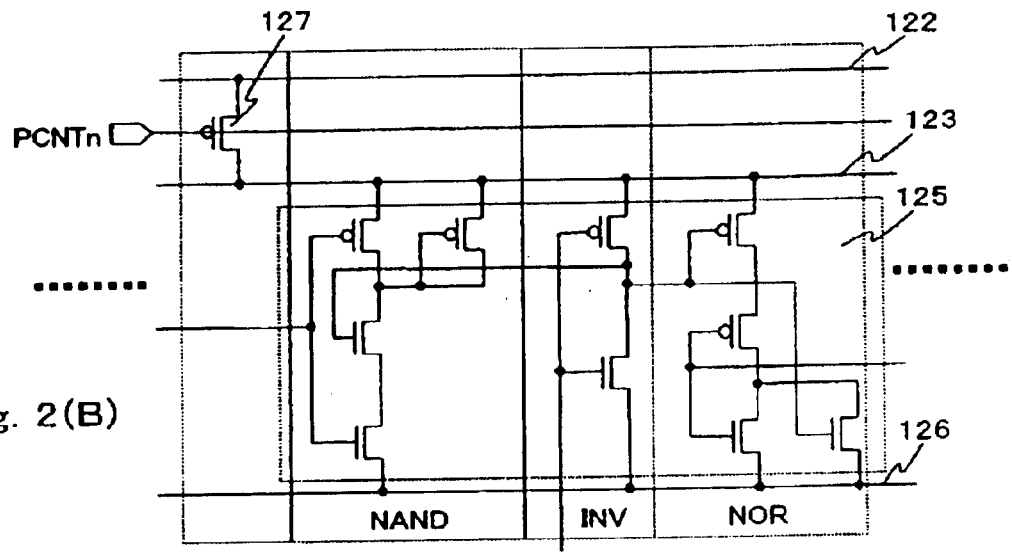
Figure 3:
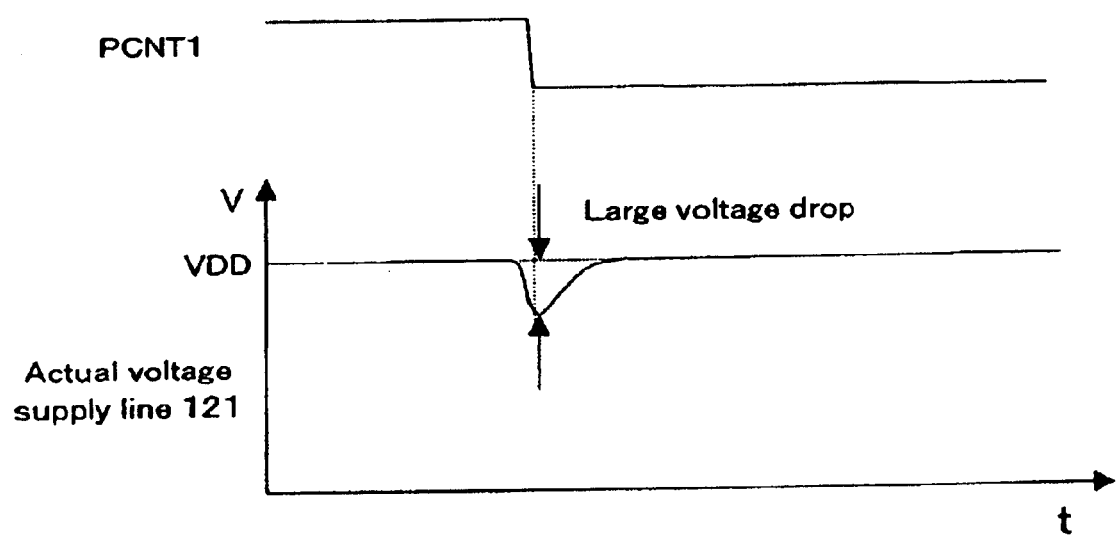
FIG. 3 is a diagram for explaining problems of the semiconductor integrated circuit utilizing the MT-CMOS technique of the conventional art.

Unlike the conventional art illustrated in FIG. 2, each logic circuit block does not include a leak current cut-off transistor therein. In each logic circuit block, the corresponding internal power supply potential line 20 works as the virtual power supply line by connecting the power supply terminals 14 and the actual power supply line 12 via the leak current cut-off transistor 13.

The power control circuit 18 supplies, under the control of the control circuit (CPU or the like, not illustrated), the power control signals PCNT1~n for controlling ON/OFF states of supply of power to each logic circuit block 11-1~n. For example, the power control circuit 18 includes a plurality of registers corresponding to the power control signals PCNT1~n and controls supply of the power control signals PCNT1~n by the control circuit writing data to the corresponding registers via the bus.

In FIG. 5, the structure of the logic circuit block 11-1 including the peripheral circuit thereof will be explained in detail among a plurality of logic circuit blocks. Here, the other logic circuit blocks 11-2~n also have the same structure and the illustration of the structures thereof are omitted.

The logic circuit 11-1 includes a plurality of power supply terminals 14A to 14F and a plurality of ground terminals 16A to 16F. Each ground terminal is connected in direct to the ground potential. A plurality of power supply terminals 14A to 14F and the actual power supply line 12 are connected with a plurality of leak current cut-off transistors 13A to 13F provided corresponding to each power supply terminal. A plurality of power supply terminals 14A to 14F form a plurality of first power supply terminals.

A plurality of leak current cut-off transistors 13A to 13F are respectively the high threshold voltage transistors having the threshold voltage higher than that of the low threshold voltage transistors included in the logic circuit block 11-1. A plurality of leak current cut-off transistors 13A to 13F are a plurality of first leak current cut-off transistors and form a first leak current cut-off circuit.

When the logic circuit block 11-1 is in the waiting condition, the leak current cut-off transistors 13A to 13F turns OFF by receiving the H level at the gate thereof, in accordance with the power control signal PCNT1 outputted from the power control circuit 18, and thereby cuts off the current path extended from the actual power supply line 12 via the power supply terminal 14 and power supply potential line (virtual power supply line) 20.

Therefore, in the first embodiment of FIG. 5, when the logic circuit block is in the waiting condition, supply of power to the internal circuit stops and thereby current dissipation in the internal circuit can also be lowered.

The gate (node N1 to node N6) of each leak current cut-off transistor is connected via the delay buffers 17A to 17E. Namely, the first delay buffer string is formed with the serial connection of a plurality of delay buffers 17A to 17E. The first delay buffer string forms the first delay control circuit 15. For example, each delay buffer may be formed by connecting in series CMOS inverters for even number stages. To the delay buffer string, the power control signal PCNT1 is supplied from the power control circuit 18.

Upon reception of the power control signal PCNT1, the above delay buffer string sequentially supplies, in response to such reception, the power control signal PCNT1 to each leak current cut-off transistor 13A to 13F with delay of a time corresponding to each delay buffer 17A to 17E.

Next, details of the operation of the semiconductor integrated circuit of FIG. 5 will be explained with reference to the waveform diagrams of FIG. 6.

Figure 6:
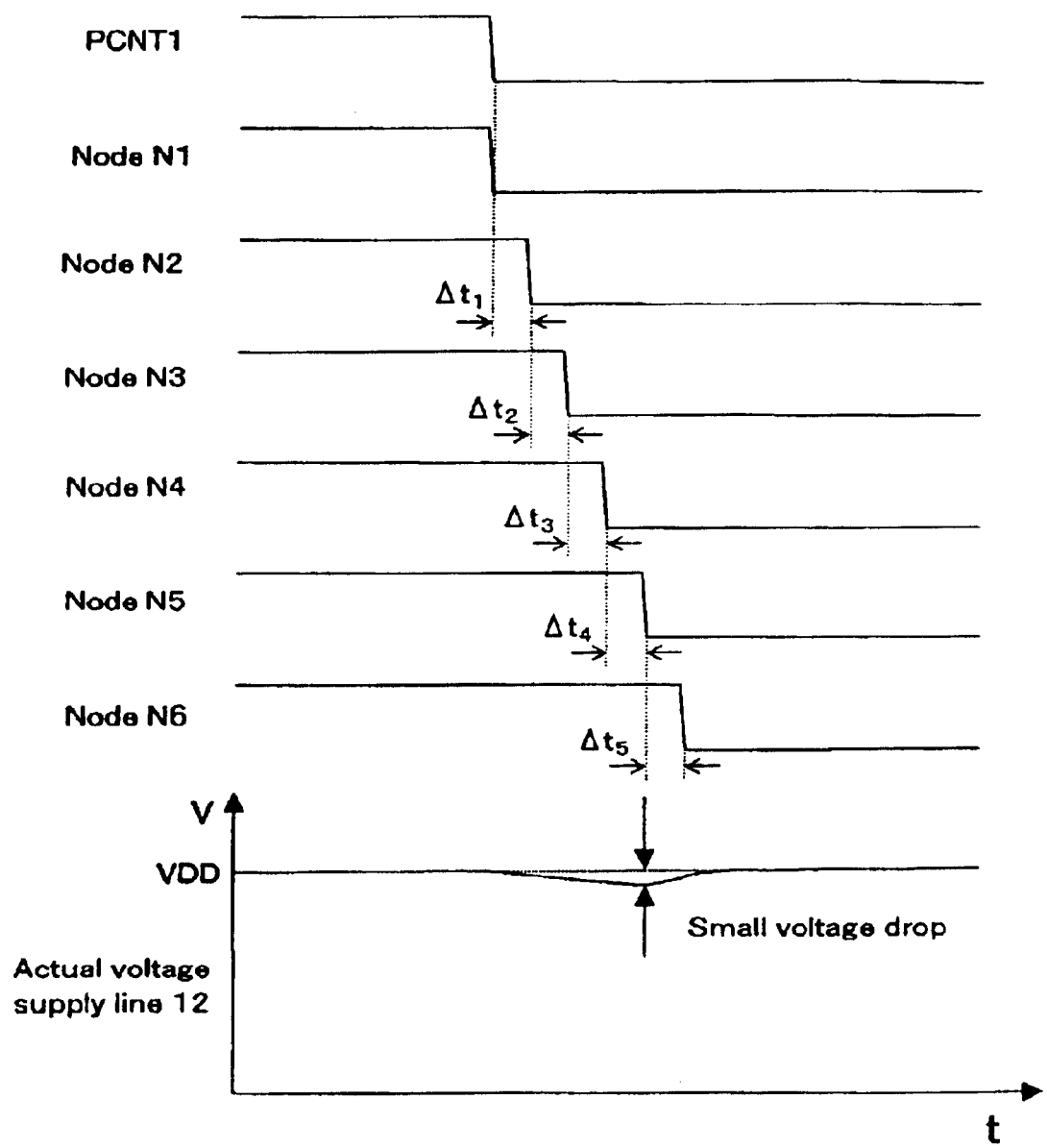
FIG. 6 is a waveform diagram for explaining operations of the delay control circuit of the first embodiment of the present invention.

FIG. 6 is a waveform diagram of the actual power supply line 12 at the timing where one logic circuit block is activated. Here is an example where the logic circuit block 11-1 in the waiting condition is activated under the condition that the logic circuit blocks 11-2~n are activated.

As illustrated in FIG. 6, in order to activate the logic circuit block 11-1, the power control circuit 18 changes the corresponding power control signal PCNT1 to the L (ground potential VSS) level from the H (power supply potential VDD) level.

In the delay buffer string, the potential of the node N1 changes first to the L level from the H level in response to the level change of the power control signal PCNT1. In response to the level change of node N1, the leak current cut-off transistor 13A turns ON.

Next, the potential of node N2 changes to the L level from the H level with delay of a time $\Delta t_1$ corresponding to the delay buffer 17A. In response to the level change, the leak current cut-off transistor 13B is turned ON with delay of the time $\Delta t_1$ from the leak current cut-off transistor 13A.

Subsequently, the potentials of nodes N3 to N6 respectively change to the L level from the H level with delay of the predetermined time corresponding to the delay buffers 17B to 17E. In response to the level change of the node N3 to N6, the leak current cut-off transistors 13C to 13F are sequentially turned ON with the predetermined time delay. According to the above process, the logic circuit block 11-1 shifts to the activated condition.

As explained above, in the first embodiment of the present invention, when the logic circuit block 11-1 is activated, the delay buffer string sequentially turns ON a plurality of leak current cut-off transistors 13A to 13F by keeping the predetermined time intervals corresponding to such delay buffers 17A to 17E. Accordingly, the electrical power is supplied on the time division basis to the logic circuit block 11-1 from the actual power supply line 12 via a plurality of power supply terminals 14A to 14F.

Therefore, the potential of the power supply potential line (virtual power supply line) 20 in the logic circuit block 11-1 rises gradually. As a result, amount of current flowing into the current path extended from the actual power supply line 12 via each leak current cut-off transistor 13 and power supply terminal 14 can be controlled to a small value.

Therefore, as illustrated in FIG. 6, voltage drop of the actual power supply line 12 can be lowered to a small value. Accordingly, power supply noise can be reduced, and thereby voltage drop of the power supply potential line (virtual power supply line) in the logic circuit blocks 11-2~n can also be reduced and erroneous operation of the circuit can also be prevented.

In addition, the power control circuit 18 holds the power control signal PCNT1 to the H level when the logic circuit block 11-1 is shifted to the waiting condition again. In response to this process, the potentials of the nodes N1 to N6 change to the H level with delay of the time corresponding to the delay buffers 17A to 17E and thereby the leak current cut-off transistors 13A to 13F sequentially turn OFF. Accordingly, after delay of the time corresponding to the delay buffer string from the level shift to the H level of the power control signal PCNT1, the logic circuit block 11-1 shifts to the waiting condition.

In FIG. 5, the power supply terminals 14 and ground terminals 16 are respectively provided in the same number as six, but the present invention is not limited to this number and desired number of power supply terminals and ground terminals may be provided. Moreover, the number of power supply terminals and ground terminals are not limited to the same number and it is also possible to provide only one ground terminal in the case of FIG. 5.

In addition, in FIG. 5, only one leak current cut-off transistor 16 is provided between the actual power supply line 12 and one power supply terminal 14, but the present invention is not limited thereto and desired number of leak current cut-off transistors may also be provided as required. A plurality of leak current cut-off transistors connected to one power supply terminal may be turned ON or OFF simultaneously in response to the same signal and may also be turned ON or OFF keeping the predetermined time delay with the same method as that for the above leak current cut-off transistors 13A to 13F.

Moreover, the amount of delay of the delay buffer 17 forming a delay buffer string may be set adequately depending on the circuit characteristic of the corresponding logic circuit block. It is enough, for example, to adjust the size and the number of connection stages of the CMOS inverters which are connected in series for the even number stages.

Figure 7:
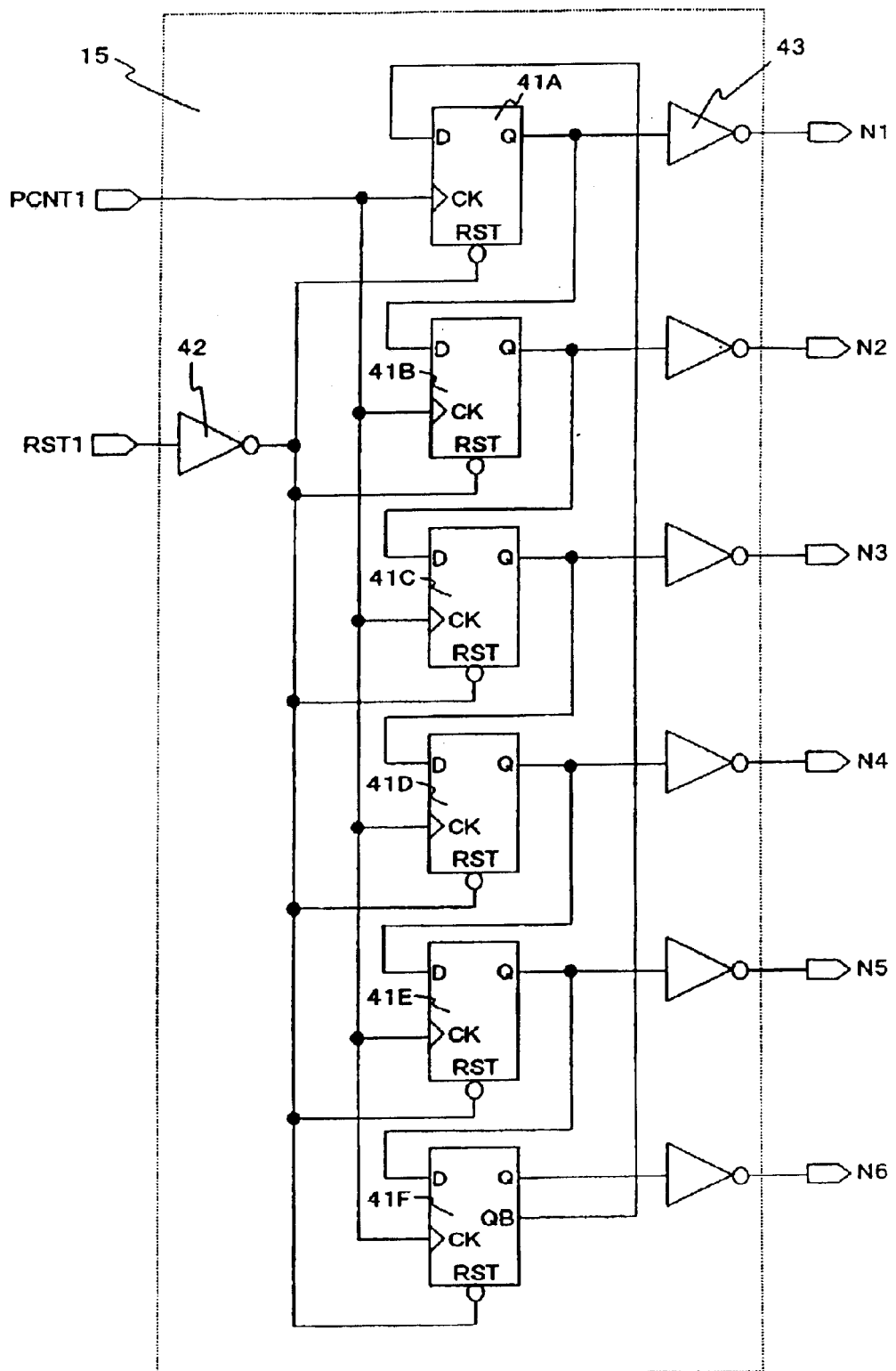
FIG. 7 is a structural diagram illustrating the second embodiment of the semiconductor integrated circuit of the present invention.

FIG. 7 is a structural diagram illustrating the second embodiment of the semiconductor integrated circuit of the present invention. The second embodiment is similar in the structure to the first embodiment illustrated in FIG. 5, except for the point that the delay control circuit 15 is formed based on the Johnson counter circuit. Therefore, the other circuits except for the delay control circuit are not illustrated and explained.

In FIG. 7, the elements like those of FIG. 5 are designated with the like reference numerals. Reference numeral 41 designates a flip-flop circuit and 42, 43 designate inverters. Since the delay control circuit 15 has the same structure for the logic circuit blocks 11-1~n, only the delay control circuit corresponding to the logic circuit block 11-1 will be explained here in detail.

In the delay control circuit 15 of FIG. 7, the flip-flop circuits 41A to 41F are connected in series and the non-inverted output terminal of the flip-flop circuit of the preceding stage is connected to the data input terminal of the flip-flop circuit of the next stage. The data input terminal of the flip-flop circuit 41A is connected with the inverted output terminal of the flip-flop circuit 41F.

The flip-flop circuits 41A to 41F are provided in the same number as the leak current cut-off transistors 13A to 13F. The flip-flop circuits 41A to 41F form the Johnson counter circuit.

In each flip-flop circuit 41A to 41F, the power control signal PCNT1 is inputted to the clock input terminal thereof, while the reset signal RST1 is inputted to the reset input terminal thereof via the inverter 42. The non-inverted output terminals of the flip-flop circuits 41A to 41F are respectively connected via the inverter 44 to the gates of the leak current cut-off transistors 13A to 13F of FIG. 5, namely, the nodes N1 to N6.

The power control circuit 18 supplies, under the control of the control circuit (CPU or the like, not illustrated), the power control signals PCNT1~n and the reset signals RST1~n for controlling ON/OFF states of the supply of power to each logic circuit block 11-1~n. For example, the power control circuit 18 includes a plurality of registers corresponding to the power control signals PCNT1~n and reset signals RST1~n and controls supply of the power control signals PCNT1~n and reset signals RST1~n by the control circuit writing data to the corresponding registers via the bus.

Next, details of operations of the delay control circuit of FIG. 7 will be explained with reference to the waveform diagram of FIG. 8.

Figure 8:
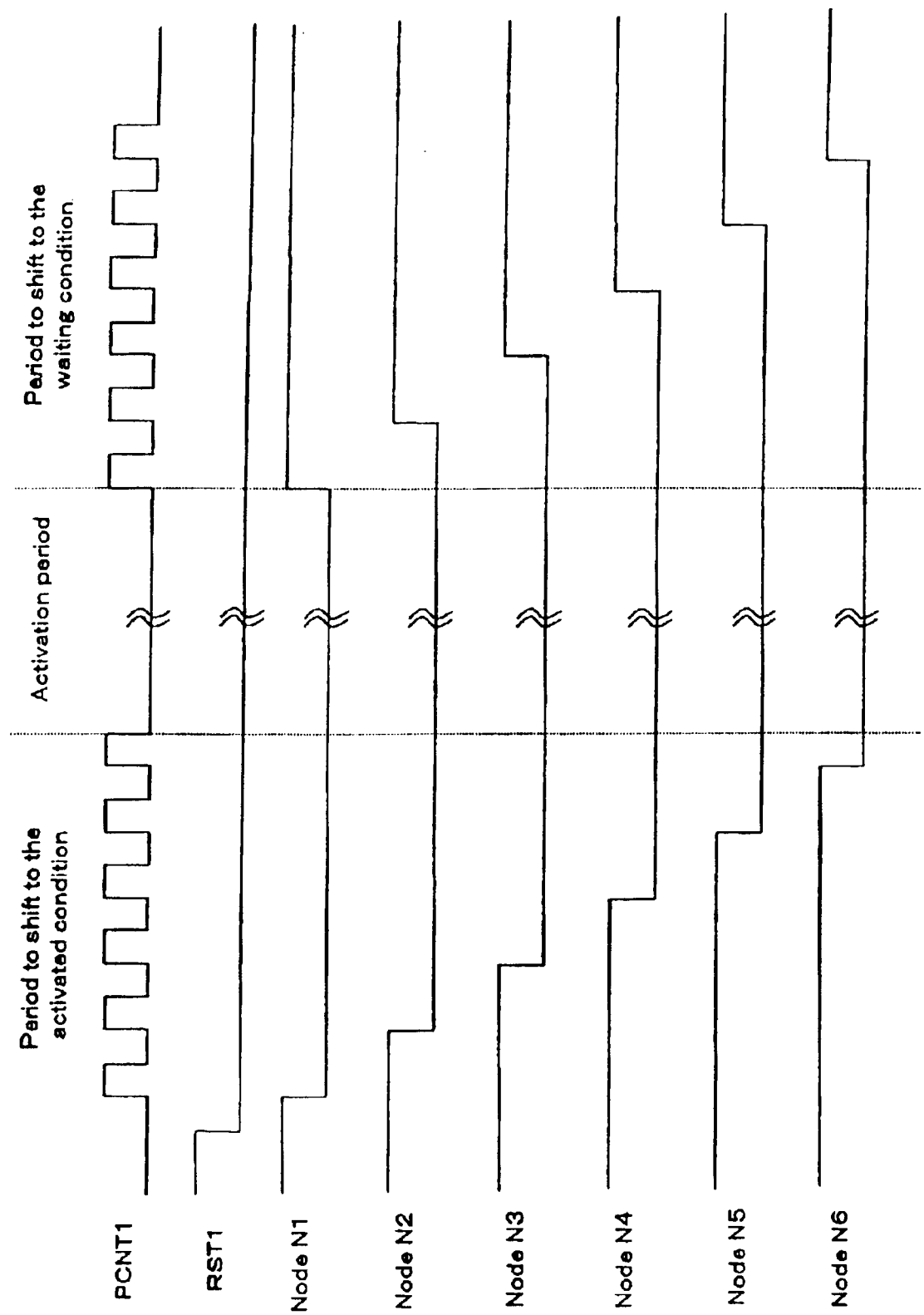
FIG. 8 is a waveform diagram for explaining operations of the delay control circuit of the second embodiment of the present invention.

As illustrated in FIG. 8, the power control circuit 18 changes, prior to changing the power control signal PCNT1, the reset signal RST1 to the L level from the H level. In response to this level change, the non-inverted output terminals of the flip-flop circuits 41A to 41F are reset to the L level, and the H level is inputted to the gates N1 to N6 of the leak current cut-off transistors 13A to 13F via the inverter 44. Moreover, the H level is outputted from the inverted output terminal of the flip-flop circuit 41F, and the H level is inputted to the data input terminal of the flip-flop circuit 41A.

Next, as illustrated in FIG. 8, the power control circuit 18 performs a toggle-output of the pulse string signal as the power control signal PCNT1. This pulse string signal has the same number of pulses as the leak current cut-off transistors 13A to 13F. This pulse string signal is inputted to the clock input terminals of the flip-flop circuits 41A to 41F.

In the first cycle of the pulse string signal, since the H level is inputted to the data input terminal from the inverted output terminal of the flip-flop circuit 41F, the flip-flop circuit 41A changes an output of the non-inverted output terminal to the H level from the L level in response to the first pulse of the pulse string signal. Accordingly the potential of the gate N1 of the leak current cut-off transistor 13A changes to the L level via the inverter 44.

In this timing, the L level from the non-inverted output terminals of the flip-flop circuits 41A to 41E is inputted to the data input terminals of the flip-flop circuits 41B to 41F and thereby the outputs of the non-inverted output terminals of the flop-flop circuits 41B to 41F are maintained in the L level.

Next, in the second cycle, since the H level from the non-inverted output terminal of the flip-flop circuit 41A is inputted to the data input terminal, the flip-flop circuit 41B changes an output of the non-inverted output terminal to the H level from the L level in response to the second pulse. Accordingly, the potential of the gate N2 of the leak current cut-off transistor 13B changes to the L level via the inverter 44.

In this timing, the L level from the non-inverted output terminals of the flip-flop circuits 41B to 41E is inputted to the data input terminal of the flip-flop circuits 41C to 41F and thereby the outputs of the non-inverted output terminals of the flip-flop circuits 41C to 41F is maintained in the L level. Moreover, the H level is inputted to the data input terminal from the inverted output terminal of the flip-flop circuit 41F and thereby an output of the non-inverted output terminal of the flip-flop circuit 41A is maintained in the H level.

In the same manner, in the third to sixth cycles, the outputs of the non-inverted output terminals of the flip-flop circuits 41C to 41F are also sequentially changed to the H level from the L level in response to the H level input of the data input terminal and the third to sixth pulses of the pulse string signal. Thereby, the potentials of the gates N3 to N6 of the leak current cut-off transistors 13C to 13F change to the L level via the inverter 44. According to the above process, the logic circuit block 11-1 shifts to the activated condition.

As explained above, in response to the input of the pulse string signal of the power control signal PCNT1, the delay control circuit 15 changes the potentials of the gates N1 to N6 of the leak current cut-off transistors 13A to 13F to the L level from the H level with delay of a time corresponding to the period of the pulse string signal and thereby turns ON the leak current cut-off transistors 13A to 13F with such time delay.

Accordingly, since the power is supplied on the time division basis from the actual power supply line 12 to the logic circuit block 11-1 via a plurality of power supply terminals 14A to 14F, the potential of the power supply potential line (virtual power supply line) rises gradually.

As a result, even in the second embodiment of the present invention, voltage drop of the actual power supply line 12 can be lowered to a small value and thereby the power supply noise can also be reduced as in the case of the first embodiment. Therefore, voltage drop of the power supply potential line (virtual power supply line) can also be reduced in the logic circuit blocks 11-2~n which are already in the activated condition and thereby erroneous operation thereof can also be prevented.

In addition, when the logic circuit block 11-1 is shifted again to the waiting condition, the power control circuit 18 performs a toggle-output of the pulse string signal as the power control signal PCNT1. The pulse string signal has the same number of pulses as the leak current cut-off transistors 13A to 13F.

First, in the first cycle of the pulse train signal, since the L level from the inverted output terminal of the flip-flop circuit 41F is inputted to the data input terminal, the flip-flop circuit 41A changes an output of the non-inverted output terminal to the L level from the H level in response to the first pulse of the pulse train signal. Accordingly, the potential of the gate N1 of the leak current cut-off transistor 13A changes to the H level via the inverter 44.

Next, in the second cycle, since the L level from the non-inverted output terminal of the flop-flop circuit 41A is inputted to the data input terminal, the flip-flop circuit 41B changes an output of the non-inverted output terminal to the L level from the H level in response to the second pulse. Accordingly, the potential of the gate N2 of the leak current cut-off transistor 13B changes to the L level via the inverter 44.

In the same manner, in the third to sixth-cycles, the flip-flop circuits 41C to 41F sequentially change the outputs of the non-inverted output terminals to the L level from the H level in response to the L level input of the data input terminal and the third to sixth pulses of the pulse train signal. Accordingly, the potentials of the gates N3 to N6 of the leak current cut-off transistors 13C to 13F sequentially change to the L level via the inverter 44.

According to the above process, after delay of a time corresponding to all pulses of the pulse string signal of the power control signal PCNT1, the leak current cut-off transistors 13A to 13F are all turned OFF and thereby the logic circuit block 11-1 shifts to the waiting condition.

Figure 9:
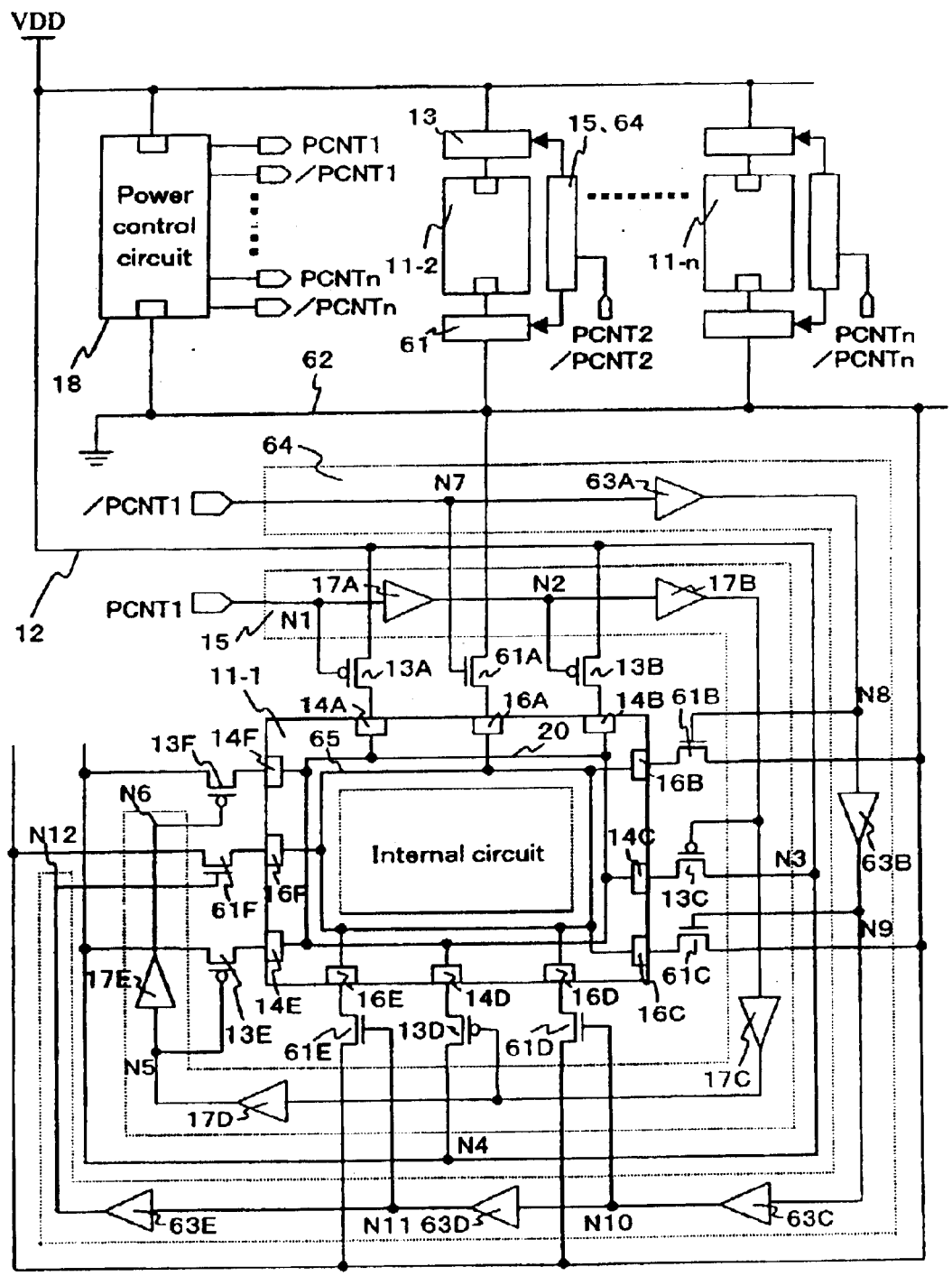
FIG. 9 is a structural diagram illustrating the third embodiment of the semiconductor integrated circuit of the present invention.

FIG. 9 is a structural diagram illustrating the third embodiment of the semiconductor integrated circuit of the present invention. The third embodiment is identical to the first embodiment of FIG. 5 in the structure, except for the point that the leak current cut-off transistors 61A to 61F are added. Therefore, explanation of the other circuits is eliminated here.

In this figure, the elements like those of FIG. 5 are designated with the like reference numerals. The reference numeral 61 designates a leak current cut-off transistor; 62, an actual ground line; 63, a delay buffer; 64, a delay control circuit; 65, a ground potential line.

In FIG. 9, a plurality of ground terminals 16A to 16F and the actual ground line 62 of the logic circuit block 11-1 are connected by a plurality of leak current cut-off transistors 61A to 61F provided corresponding to each ground terminal. The actual ground line 62 forms the second power supply line and a plurality of ground terminals 16A to 16F form a plurality of second power supply terminals.

A plurality of leak current cut-off transistors 61A to 61F are respectively NMOS transistors and the high threshold voltage transistors having the threshold voltage higher than that of the low threshold voltage transistors included within the logic circuit block 11-1. A plurality of leak current cut-off transistors 61A to 61F are a plurality of second leak current cut-off transistors and form the second leak current cut-off circuit.

The gates (nodes N7 to N12) of the leak current cut-off transistors 61A to 61F are connected via the delay buffers 63A to 63E. The second delay buffer string is formed of the serial connection of a plurality of delay buffers 61A to 61E.

The second delay buffer string forms the second delay control circuit 64. Each delay buffer can be formed, for example, by connecting in series the CMOS inverters for the even number of stages.

The power control circuit 18 supplies the power control signal /PCNT1 to the above delay buffer string. The power control signal /PCNT1 is an inverted signal of the power control signal PCNT1 illustrated in FIG. 5. As explained above, in the third embodiment, the power control circuit 18 supplies, under the control of the control circuit (CPU or the like, not illustrated), the power control signals PCNT1~n for controlling ON/OFF states of the supply of power to the logic circuit blocks 11-1~n and the signals /PCNT1~n which are inverted signals of the power control signals PCNT1~n.

When the logic circuit block 11-1 is in the waiting condition, the leak current cut-off transistors 61A to 61F turn OFF depending on the power control signal /PCNT1. Thereby the current path between the actual power supply line 12 and the power supply potential line (virtual power supply line) 20 is cut off by the leak current cut-off transistors 13A to 13F and moreover the current path extended from the actual ground line 62 via the ground terminal 16 and ground potential line (virtual ground line) 65 is also cut off.

Therefore, in the third embodiment of FIG. 9, when the logic circuit block is in the waiting condition, supply of power to the internal circuit is surely stopped and current dissipation in the internal circuit can surely be reduced.

Next, operations of the delay control circuit of FIG. 9 will be explained in detail.

When the power control circuit 18 changes, as illustrated in FIG. 6, the corresponding power control signal PCNT1 to the L level from the H level in order to activate the logic circuit block 11-1, the power control signal /PCNT1 changes to the H level from the L level in response to this level change. In the same manner as in the case of FIG. 6, the delay buffer string sequentially changes the potentials of the nodes N7 to N12 to the H level from the L level with delay of a time corresponding to the delay buffers 63A to 63E in response to the level change of the power control signal /PCNT1.

Therefore, when the logic circuit block 11-1 is activated, a plurality of leak current cut-off transistors 61A to 61F are sequentially turned ON keeping the predetermined time interval corresponding to the delay buffers 63A to 63E, and thereby the power is supplied to the logic circuit block 11-1 on the time division basis from the actual ground line 62 via a plurality of ground terminals 16A to 16F. As a result, amount of current flowing into the current path extended from the actual ground line 62 via the leak current cut-off transistor 61 and the ground terminal 16 can be reduced to a small value.

Therefore, in the third embodiment of the present invention, voltage drop of the actual power supply line 12 can be reduced and moreover rise of potential of the actual ground line 62 can also be controlled to a small value. Thereby, the power supply noise of the actual power supply line 12 and actual ground line 62 can be reduced.

Accordingly, since voltage drop of the power supply potential supply line (virtual power supply line) 20 and rise of voltage of the ground potential line (virtual ground line) 65 can be reduced in the other logic circuit blocks 11-2~n in the activated condition, erroneous operation of the circuit can be prevented more reliably.

In FIG. 9, as in the case of FIG. 5, the power supply terminals 14 and ground terminals 16 are provided in the same numbers as six, but the present invention is not limited thereto and the desired number of power supply terminals and ground terminals can be provided as required.

Moreover, only one leak current cut-off transistor 61 is provided between the actual ground line 62 and one ground terminal 16, but the present invention is not limited thereto and the desired number of leak current cut-off transistors may be provided as required. It is also possible that a plurality of leak current cut-off transistors connected to one ground terminal are turned ON and OFF simultaneously in response to the same signal or keeping the predetermined time delay with the same method as that for the leak current cut-off transistors 61A to 61F.

Moreover, the number of power supply terminals is set equal to the number of ground terminals, but the present invention is not limited thereto. In addition, the delay time of the delay buffers 17 and 63 forming the delay buffer strings may be set as required depending on the circuit characteristic of the corresponding logic circuit block.

Modification examples of the semiconductor integrated circuit of FIG. 9 will be explained below.

Figure 10:
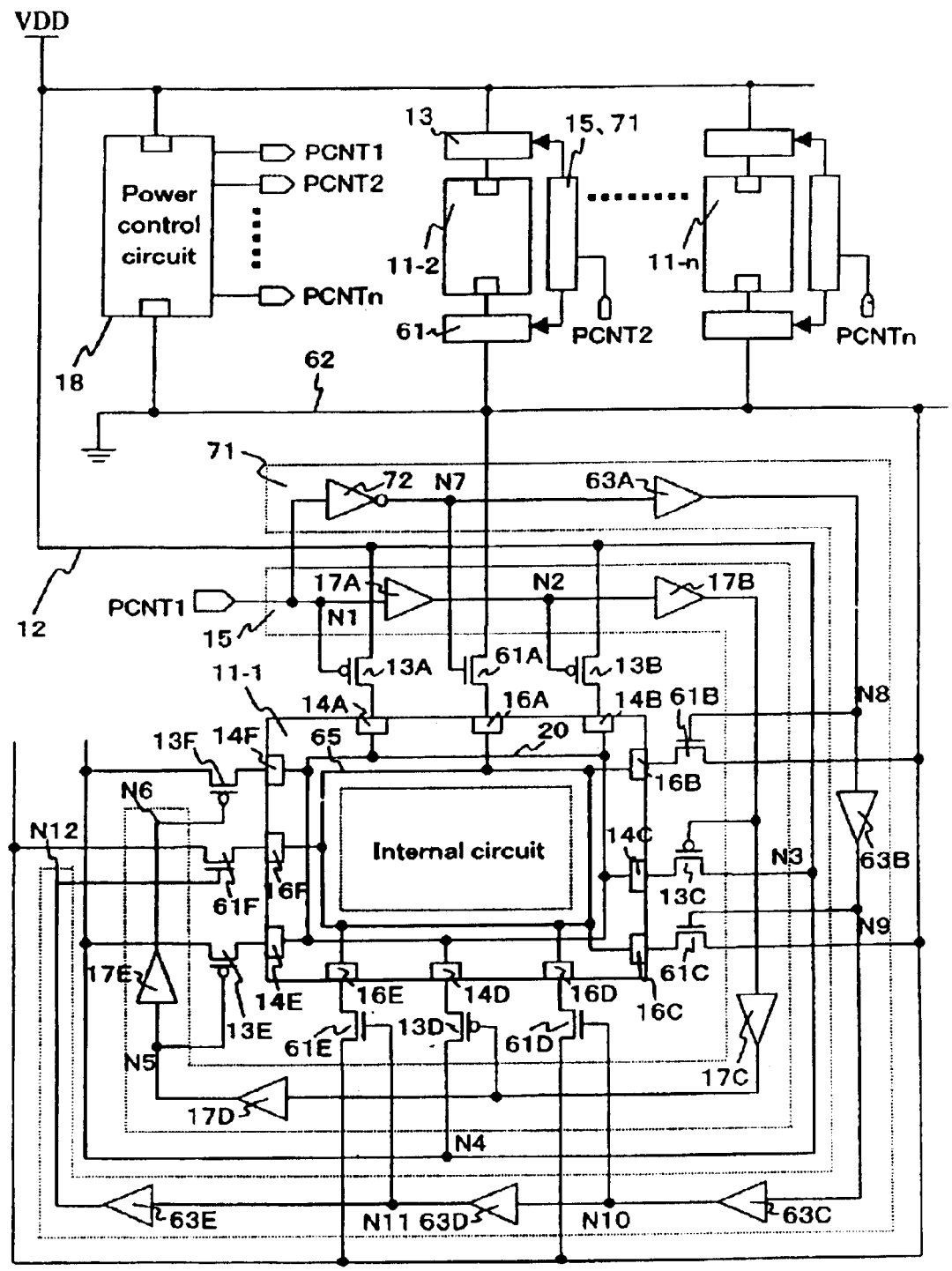
FIG. 10 is a diagram for explaining a modification example of the semiconductor integrated circuit of the third embodiment of the present invention.
Figure 11:
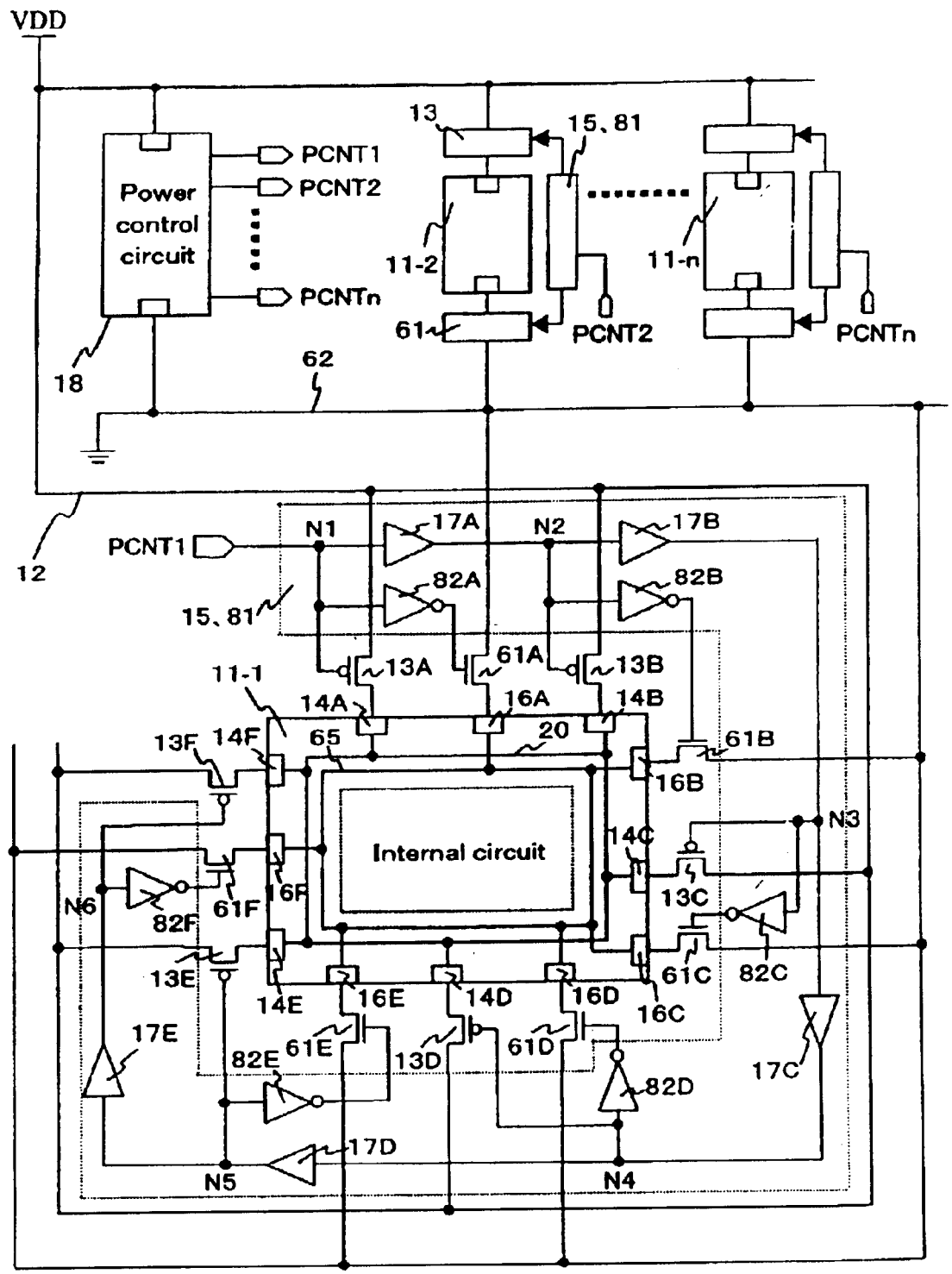
FIG. 11 is a diagram for explaining a modification example of the semiconductor integrated circuit of the third embodiment of the present invention.

FIG. 10 and FIG. 11 are diagrams for explaining modification examples of the semiconductor integrated circuit of the third embodiment of the present invention. In this figure, the elements like those of FIG. 9 are designated with the like reference numerals. The reference numerals 71, 81 designate a delay control circuit and 72, 82, an inverter.

The delay control circuit 64 of FIG. 9 operates in response to the power control signal /PCNT1 (inverted signal of PCNT1) outputted from the power control circuit 18, while, in FIG. 10 and FIG. 11, the delay control circuit for controlling the ON/OFF states of the leak current cut-off transistors 63A to 63F is operated in response to the power control signal PCNT1 in the delay control circuit 15.

Therefore, in the delay control circuit 71 of FIG. 10, an inverter 72 is added between the node N7 of the delay buffer string and the input terminal of the power control signal PCNT1. In the delay control circuit 81 of FIG. 11, the delay buffer string is used in common by both the leak current cut-off transistors 16A to 16F and the leak current cut-off transistors 61A to 61F and the inverters 82A to 82E are added between the nodes N1(N7) to N6(N12) and the leak current cut-off transistors 61A to 61F.

Like the delay control circuit 64 of FIG. 9, the delay control circuit of FIG. 10 (FIG. 11) can sequentially turns ON the leak current cut-off transistors 61A to 61F with delay of the time corresponding to the delay buffers 63A to 63E (17A to 17E) in response to the power control signal PCNT1.

Moreover, for the delay control circuit 64 of FIG. 9, the delay control circuit which is formed of the Johnson counter circuit of FIG. 7 may be used in place of the circuit which is formed of the delay buffer string. In this case, it is also possible that the delay control circuit is operated in response to the power control signal /PCNT1 (inverted signal of PCNT1) outputted from the power control circuit or to the power control signal PCNT1.

When the delay control circuit is operated in response to the power control signal PCNT1, the Johnson counter circuit is used in common by both the leak current cut-off transistors 16A to 16F and leak current cut-off transistors 61A to 61F and the non-inverted output terminals of the flip-flop circuits 41A to 41F are connected to the gates N7 to N12 of the leak current cut-off transistors 61A to 61F without via the inverter 44.

Moreover, as the modification example of the semiconductor integrated circuit of FIG. 9, it is possible that only the leak current cut-off circuit 61 in the side of actual ground line and the corresponding delay control circuit 64 are left and the leak current cut-off circuit 13 in the side of actual power supply line and the corresponding delay control circuit 15 are eliminated.

Even in this modification example, when the logic circuit block is in the waiting condition, the leak current cut-off transistors 61A to 61F cut off the current path extended from the actual ground line 62 via the ground terminal 16 and ground potential line (virtual ground line) 65. Therefore, supply of power to the internal circuit of the logic circuit block can be stopped and current dissipation in the internal circuit can be reduced.

Figure 12:
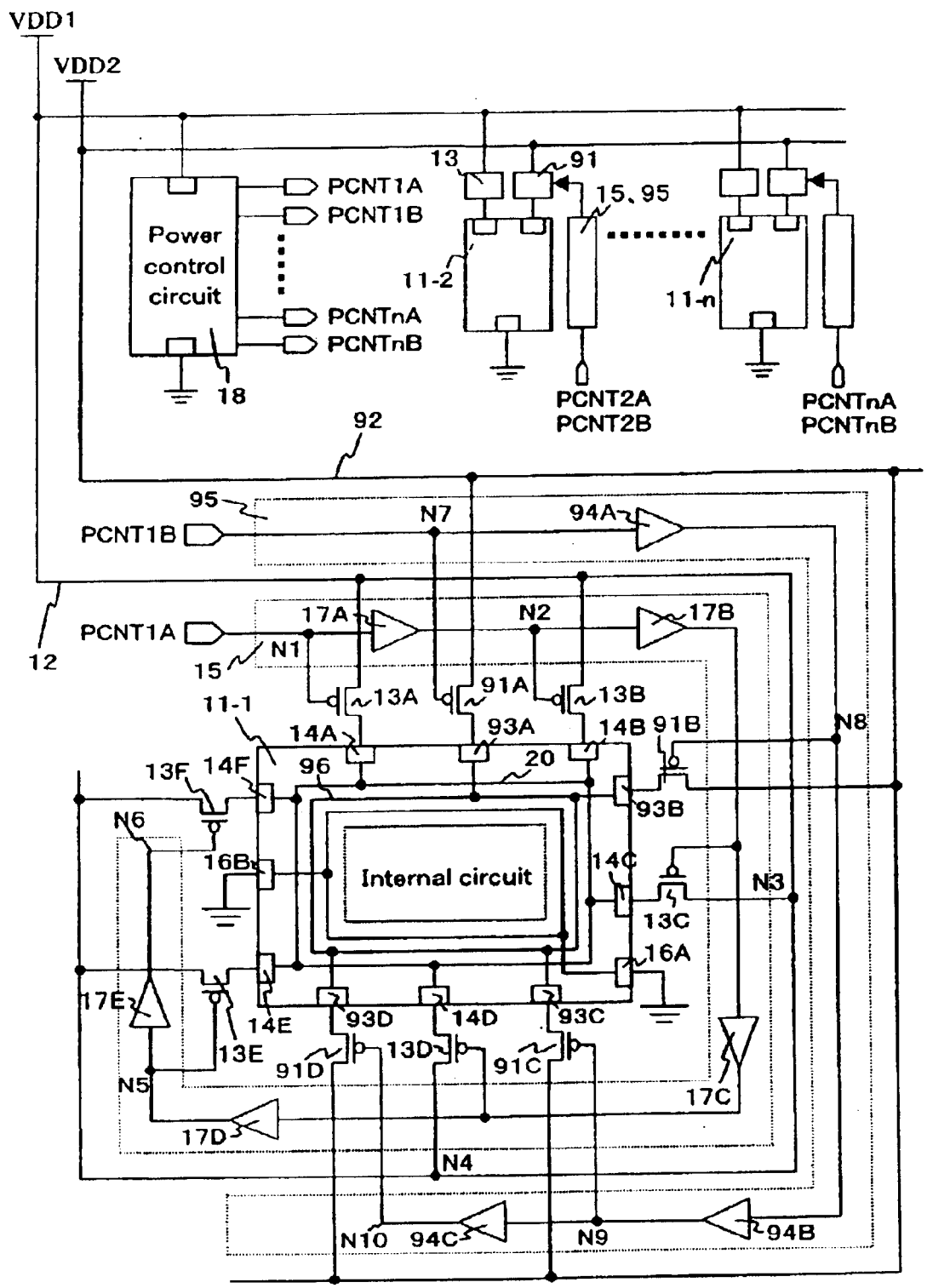
FIG. 12 is a structural diagram illustrating the fourth embodiment of the semiconductor integrated circuit of the present invention.

FIG. 12 is a structural diagram illustrating the fourth embodiment of the semiconductor integrated circuit of the present invention. The fourth embodiment is identical, in the structure, to the first embodiment of FIG. 5, except for the point that the leak current cut-off transistors 91A to 91D, actual power supply line 92 and power supply terminals 93A to 93D are added. Therefore, explanation of the other circuits is eliminated here.

In FIG. 12, the elements like those of FIG. 5 are designated with the like reference numerals. Reference numeral 91 designates a leak current cut-off transistor; 92, an actual power supply line; 93, a power supply terminal; 94, a delay buffer; 95, a delay control circuit and 96, a power supply potential line.

In FIG. 12, the logic circuit block 11-1 is formed including two kinds of circuit elements which are operated with the power supply voltage VDD1 supplied to the actual power supply line 12 and are operated with the power supply voltage VDD2 which is different from the power supply voltage VDD1. The power supply voltage VDD2 is supplied by the actual power supply line 92. A plurality of power supply terminals 93A to 93D are provided to the logic circuit block 11-1 corresponding to the actual power supply line 92. The actual power supply line 92 forms the second power supply line and a plurality of power supply terminals 93A to 93D form a plurality of second power supply terminals.

A plurality of power supply terminals 93A to 93D and the actual power supply line 92 are connected by a plurality of leak current cut-off transistors 91A to 91D provided corresponding to each power supply terminal. A plurality of leak current cut-off transistors 91A to 91D are respectively PMOS transistors and the high threshold voltage transistors having the threshold voltage higher than that of the low threshold voltage transistors included in the logic circuit block 11-1. The leak current cut-off transistors 91A to 91D are a plurality of the second leak current cut-off transistors and form the second leak current cut-off circuit.

The gates (nodes N7 to N10) of the leak current cut-off transistors 91A to 91D are connected via the delay buffers 94A to 94C. The second delay buffer string is formed with serial connection of a plurality of delay buffers 94A to 94C. The second delay buffer string forms the second delay control circuit 95. Each delay buffer may be formed, for example, by serially connecting the CMOS inverters in the even number stages.

The power control circuit 18 supplies the power control signal PCNT1A to the delay buffer string of the delay control circuit 15 and also supplies the power control signal PCNT1B to the above delay buffer string of the delay control circuit 95. The power control signal PCNT1B is a power control signal for controlling ON/OFF states of supply of power to the logic circuit block 11-1 from the actual power supply 92.

In the fourth embodiment, the power control circuit 18 supplies, to the logic circuit blocks 11-1~n under the control of the control circuit (CPU or the like, not illustrated), the power control signals PCNT1A~nA for controlling ON/OFF states of supply of power from the actual power supply line 12 and the power control signals PCNT1B~nB for controlling ON/OFF states of supply of power from the actual power supply line 92.

When the logic circuit block 11-1 is in the waiting condition, the leak current cut-off transistors 91A to 91D turn OFF depending on the power control signal PCNT1B. Thereby the leak current cut-off transistors 13A to 13F cut off the current path extended between the actual power supply line 12 and the power supply potential line (virtual power supply line) 20 and the leak current cut-off transistors 91A to 91D also cut off the current path extended from the actual power supply line 92 via the power supply terminal 93 and power supply potential line (virtual power supply line) 96.

Therefore, in the fourth embodiment, when the logic circuit block is in the waiting condition, supplies of power to the internal circuit from two actual power supply lines 12 and 92 stop and thereby current dissipation in the internal circuit can be reduced.

Next, details of the operations of the delay control circuit of FIG. 12 will be explained.

When the power control circuit 18 changes the power control signal PCNT1B to the L level from the H level in order to activate the logic circuit block 11-1, the corresponding delay buffer string changes, as in the case of FIG. 6, the potential of the nodes N7 to N10 to the L level from the H level with delay of a time corresponding to the delay buffers 94A to 94C in response to the level change of the power control signal PCNT1B.

Therefore, when the logic circuit block 11-1 is activated, a plurality of leak current cut-off transistors 91A to 91D are sequentially turned ON keeping the predetermined time interval corresponding to the delay buffers 94A to 94C. Therefore, supply of power to the logic circuit block 11-1 is performed on the time division basis with the actual power supply line 92 via a plurality of power supply terminals 93A to 93D. As a result, amount of current flowing into the current path extended from the actual power supply line 92 via the leak current cut-off transistor 91 and power supply terminal 93 can be lowered to a small value.

Therefore, in the fourth embodiment, voltage drop of the actual power supply line 12 can be reduced and moreover voltage drop of the actual power supply line 92 can also be lowered. Accordingly, power supply noise of the actual power supply lines 12 and 92 can also be reduced.

Therefore, voltage drop of the power supply potential line (virtual power supply line) 96 in the other logic circuit blocks 11-2~n in the activated condition is also reduced in addition to the voltage drop of the power supply potential line (virtual power supply line) 20, and thereby erroneous operation of the circuit can surely be prevented.

In this embodiment, only one leak current cut-off transistor 91 is provided between the actual power supply line 92 and one power supply terminal 93, but the present invention is not limited thereto and desired number of leak current cut-off transistors may be provided as required. A plurality of leak current cut-off transistors connected to one power supply terminal may also be controlled to be turned ON or OFF simultaneously in response to the same signal and may also be turned ON or OFF with the predetermined time delay with the same method as that for the leak current cut-off transistors 91A to 91D.

Moreover, amount of delay of the delay buffers 17 and 94 forming the delay buffer strings may be set adequately depending on the circuit characteristic of the corresponding logic circuit block. The leak current cut-off transistors 16 and 91 may be formed of the transistors having the equal threshold voltage and may also be formed of the transistors having different threshold voltages.

A modification example of the semiconductor integrated circuit of FIG. 12 will be explained below.

Figure 13:
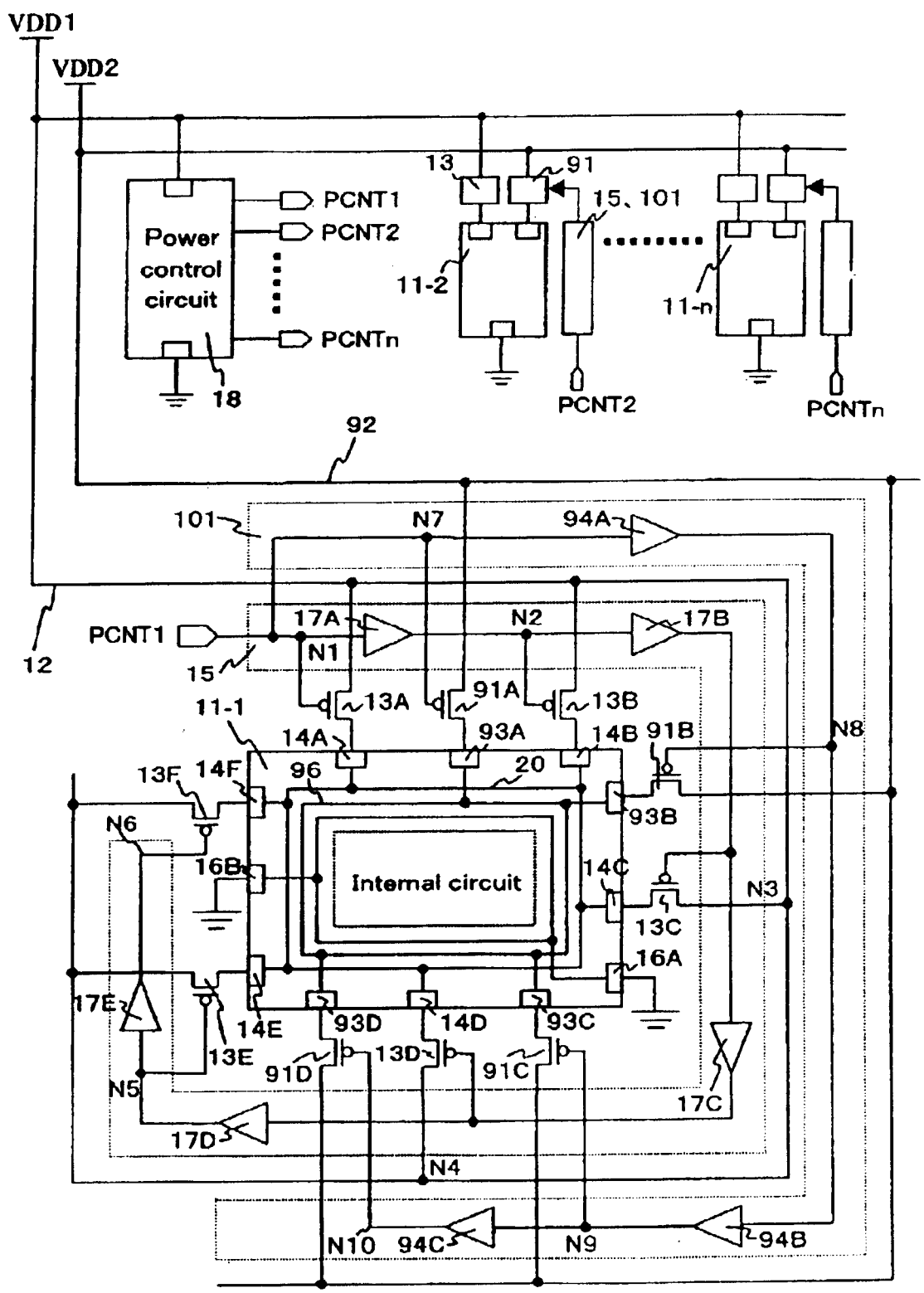
FIG. 13 is a diagram for explaining a modification example of the semiconductor integrated circuit of the fourth embodiment of the present invention.
Figure 14:
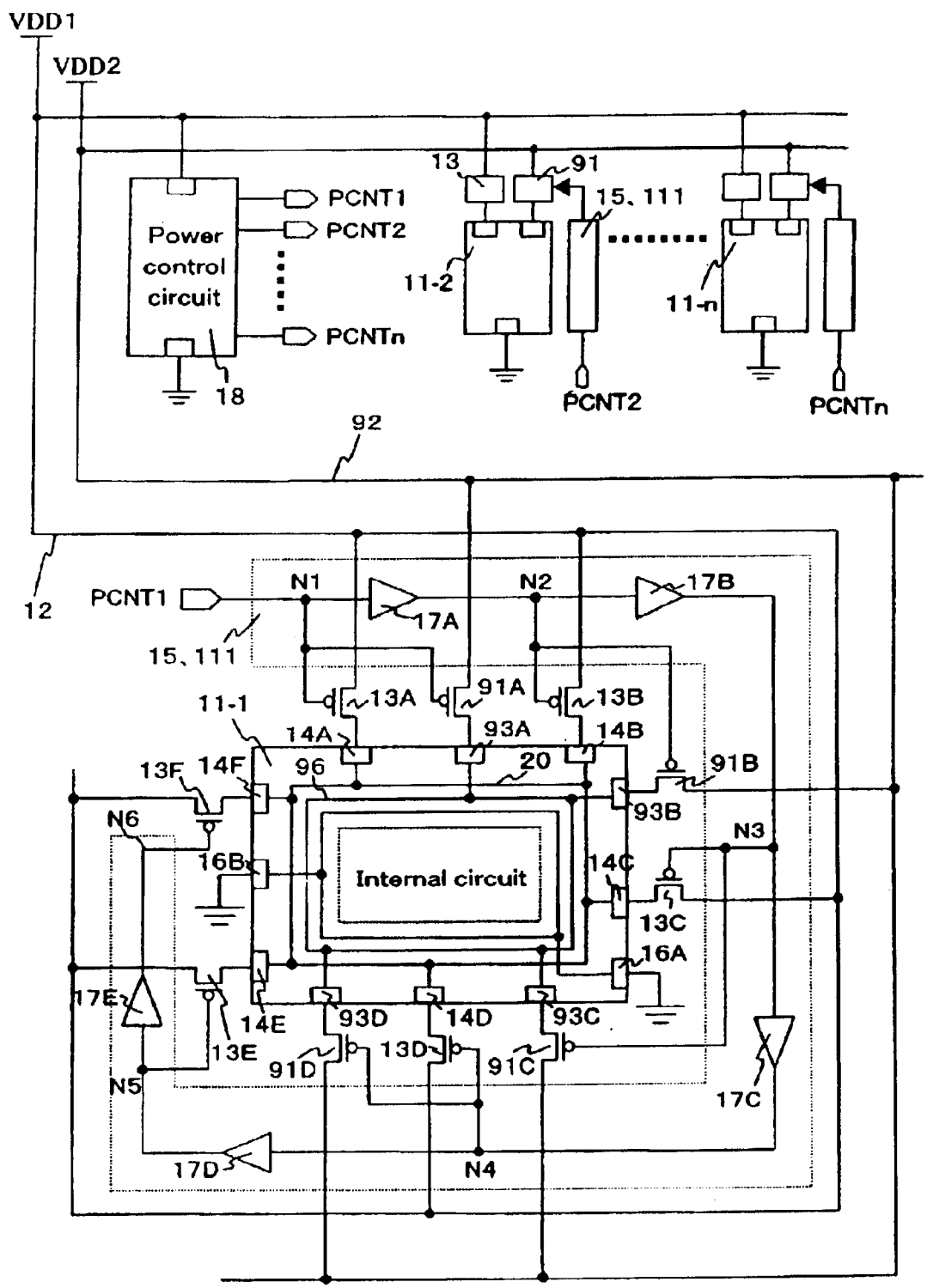
FIG. 14 is a diagram for explaining a modification example of the semiconductor integrated circuit of the fourth embodiment of the present invention.

FIG. 13 and FIG. 14 are diagrams for explaining the modification examples of the semiconductor integrated circuit of the fourth embodiment of the present invention. The elements like those of FIG. 12 are designated with the like reference numerals. Reference numerals 101, 111 are delay control circuit.

The delay control circuit 95 of FIG. 12 operates in response to the power control signal PCNT1B outputted from the power control circuit 18, while the delay control circuit for controlling ON/OFF states of the leak current cut-off transistors 91A to 91D is operated in response to the power control signal PCNT1 supplied to the delay control circuit 15 in FIG. 13 and FIG. 14.

Therefore, the node N7 of the delay buffer string and the input terminal of the power control signal PCNT1 are connected in the delay control circuit 101 of FIG. 13. Moreover, in the delay control circuit 111 of FIG. 14, the delay buffer string is used in common by both the leak current cut-off transistors 16A to 16F and the leak current cut-off transistors 91A to 91D and the nodes N1(N7) to N4(N10) and the leak current cut-off transistors 91A to 91D are connected.

Similar to the delay control circuit 95 of FIG. 12, the delay control circuits of FIG. 13 (FIG. 14) can sequentially turn ON the leak current cut-off transistors 91A to 91D with delay of the time corresponding to the delay buffers 94A to 94C (17A to 17C) in response to the power control signal PCNT1.

Moreover, for the delay control circuit 95 of FIG. 12, the delay control circuit which is formed of the Johnson counter circuit illustrated in FIG. 7 may be used in place of the circuit which is formed of the delay buffer string.

In the first to fourth embodiments, the PMOS transistor has been used as the leak current cut-off transistor in the side of the actual power supply line side is used, but this transistor may also be replaced with the NMOS transistor.

While the present invention has been described in reference to a specific embodiment, the scope of the invention is not limited to that embodiment and is deemed to include the scope as set out in the appended claimed and their equivalents.

What is claimed is:

1. A semiconductor integrated circuit comprising:
   a first power supply line to which a first potential is supplied;
   a logic circuit block which includes a first transistor having a first threshold voltage and a plurality of first power supply terminals;
   a first leak current cut-off circuit which is provided between the first power supply line and the logic circuit block and includes a second transistor having a second threshold voltage which is higher than the first threshold voltage, said first leak current cut-off circuit electrically connecting or disconnecting the first power supply line and the plurality of first power supply terminals; and
   a first delay control circuit which controls the first leak current cut-off circuit to sequentially connect the first power supply line and each of the plurality of first power supply terminals with a predetermined time delay when the logic circuit block is activated.

2. The semiconductor integrated circuit according to claim 1,
   wherein said first leak current cut-off circuit includes a plurality of first leak current cut-off transistors which are provided between the first power supply line and the plurality of first power supply terminals and are composed of the second transistors, and
   said first delay control circuit turns ON, when the logic circuit block is activated, each of the plurality of first leak current cut-off transistors with the predetermined time delay.

3. The semiconductor integrated circuit according to claim 2,
   wherein said first delay control circuit includes a first delay buffer string in which a plurality of delay buffers are connected in series and to one end of which a first power control signal for controlling ON and OFF states of supply of power to the logic circuit block is supplied,
   connection nodes of the first delay buffer string are connected to gates of the plurality of leak current cut-off transistors, and
   when a level of the first power control signal changes, each of the first leak current cut-off transistors turns ON or OFF with delay of a time corresponding to the delay buffer in response to a level change of the connection node of the first delay buffer string.

4. The semiconductor integrated circuit according to claim 2,
   wherein said first delay control circuit includes a Johnson counter circuit, said Johnson counter circuit being composed of a plurality of flip-flop circuits to clock inputs of which a first power control signal for controlling ON and OFF states of supply of power to the logic circuit block is supplied;
   outputs of the plurality of flop-flop circuits are connected to gates of the plurality of leak current cut-off transistors; and
   when a pulse string signal having a plurality of pulses is inputted as the first power control signal, each of the first leak current cut-off transistors turns ON or OFF with delay of a time corresponding to a period of the pulse string signal in response to a level change of the output of the plurality of flip-flop circuits.

5. The semiconductor integrated circuit according to claim 3, further comprising:
   a power control circuit which generates the first power control signal when the logic circuit block is activated.

6. The semiconductor integrated circuit according to claim 4, further comprising:
   a power control circuit which generates the first power control signal when the logic circuit block is activated.

7. The semiconductor integrated circuit according to claim 2,
   wherein the first potential of the first power supply line is a power supply voltage potential, and
   the first leak current cut-off transistor is a PMOS transistor.

8. The semiconductor integrated circuit according to claim 2,
   wherein the first potential of the first power supply line is a ground potential, and the first leak current cut-off transistor is an NMOS transistor.

9. The semiconductor integrated circuit according to claim 1,
wherein said logic circuit block further includes a third transistor having a third threshold voltage and a plurality of second power supply terminals, and
said semiconductor integrated circuit further comprises:
a second power supply line to which a second potential which is different from the first potential is supplied;
a second leak current cut-off circuit which is provided between the second power supply line and the logic circuit block and includes a fourth transistor having a fourth threshold voltage which is higher than the third threshold voltage, said second leak current cut-off circuit electrically connecting or disconnecting the second power supply line and the plurality of second power supply terminals; and
a second delay control circuit which controls the second leak current cut-off transistors to sequentially connect the second power supply line and each of the plurality of second power supply terminals with the predetermined time delay when the logic circuit block is activated.

10. The semiconductor integrated circuit according to claim 9,
wherein said second leak current cut-off circuit include a plurality of second leak current cut-off transistors which are provided between the second power supply line and the plurality of second power supply terminals and are composed of the fourth transistors; and
said second delay control circuit turns ON, when the logic circuit block is activated, each of the plurality of second leak current cut-off transistors with the predetermined time delay.

11. The semiconductor integrated circuit according to claim 10,
wherein the second delay control circuit includes a second delay buffer string in which a plurality of delay buffers are connected in series and to one end of which a second control signal for controlling ON and OFF states of supply of power to the logic circuit block is supplied,
connection nodes of the second delay buffer string are connected to gates of the plurality of second leak current cut-off transistors, and
when a level of the second power control signal changes, each of the second leak current cut-off transistors turns ON or OFF with delay of a time corresponding to the delay buffer in response to a level change of the connection node of the second delay buffer string.

12. The semiconductor integrated circuit according to claim 10,
wherein the first delay control circuit is supplied with a first power control signal for controlling ON and OFF states of supply of power to the logic circuit block and controls the first leak current cut-off circuit in response to the first power control signal,
the second delay control circuit includes a second delay buffer string in which a plurality of delay buffers are connected in series and to one end of which the first power control signal is supplied,
connection nodes of the second delay buffer string are connected to gates of the plurality of second leak current cut-off transistors, and
when a level of the first power control signal changes, each of the second leak current cut-off transistor turns ON or OFF with delay of a time corresponding to the delay buffer in response to a level change of the connection node of the second delay buffer string.

13. The semiconductor integrated circuit according to claim 12,
wherein the first power control signal is supplied as an inverted signal to the second delay buffer string.

14. The semiconductor integrated circuit according to claim 12,
wherein the first power control signal is supplied without inversion to the second delay buffer string.

15. The semiconductor integrated circuit according to claim 10,
wherein the first delay control circuit and the second delay control circuit includes in common a first delay buffer string in which a plurality of delay buffers are connected in series and to one end of which the first power control signal for controlling ON and OFF states of supply of power to the logic circuit block is supplied,
connection nodes of the first delay buffer string are connected to gates of the second leak current cut-off transistors, and
when a level of the first power control signal changes, each of the second leak current cut-off transistors turns ON or OFF with delay of a time corresponding to the delay buffer in response to a level change of the connection node of the first delay buffer string.

16. The semiconductor integrated circuit according to claim 15,
wherein the connection nodes of the first delay buffer string are connected to the gates of the second leak current cut-off transistors via a plurality of inverters.

17. The semiconductor integrated circuit according to claim 15,
wherein the connection nodes of the first delay buffer string are connected in direct to the gates of the second leak current cut-off transistors.

18. The semiconductor integrated circuit according to claim 11, further comprising:
a power control circuit which generates the second power control signal when the logic circuit block is activated.

19. The semiconductor integrated circuit according to claim 10,
wherein the second potential of the second power supply line is a ground potential, and
the second leak current cut-off transistor is an NMOS transistor.

20. The semiconductor integrated circuit according to claim 10,
wherein the second potential of the second power supply line is a power supply voltage potential, and
the second leak current cut-off transistor is a PMOS transistor.

21. A semiconductor integrated circuit comprising:
a first power supply line to which a first potential is supplied;
a second power supply line to which a second potential different from the first potential is supplied;
a logic circuit block which includes a first transistor having a first threshold voltage, a third transistor having a third threshold voltage, a plurality of first power supply terminals and a plurality of second power supply terminals;

a plurality of first leak current cut-off transistors which are provided between the first power supply line and the plurality of first power supply terminals and are composed of second transistors having a second threshold voltage higher than the first threshold voltage;

a plurality of second leak current cut-off transistors which are provided between the second power supply line and the plurality of second power supply terminals and are composed of fourth transistors having a fourth threshold voltage higher than the third threshold voltage; and a delay control circuit which, when the logic circuit block is activated, turns ON the plurality of first leak current cut-off transistors with a predetermined time delay and also turns ON the plurality of second leak current cut-off transistors with the predetermined time delay.

22. The semiconductor integrated circuit according to claim 20, wherein the first potential of the first power supply line is a power supply voltage potential, the second potential of the second power supply line is a ground potential, the first leak current cut-off transistor is a PMOS transistor, and the second leak current cut-off transistor is an NMOS transistor.

23. The semiconductor integrated circuit according to claim 21, wherein the first potential of the first power supply line is a first power supply voltage potential, the second potential of the second power supply line is a second power supply voltage potential different from the first power supply voltage potential, the first leak current cut-off transistor is a PMOS transistor, and the second leak current cut-off transistor is a PMOS transistor.

24. The semiconductor integrated circuit according to claim 19, further comprising:

a power control circuit which generates a first power control signal and a second power control signal for controlling ON and OFF states of supply of power to the logic circuit block when the logic circuit block is activated, wherein the plurality of first leak current cut-off transistors are turned ON or OFF in response to the first power control signal, and the plurality of second leak current cut-off transistors are turned ON or OFF in response to the second power control signal.

25. The semiconductor integrated circuit according to claim 24, wherein the second power control signal is an inverted signal of the first power control signal.

26. The semiconductor integrated circuit according to claim 1, further comprising a second leak current cut-off circuit which is provided between the logic circuit and a ground line; and a second delay control circuit which is provided to control the second leak current cut-off circuit.

* * * * *